United States Patent [19]
Lynch

[11] Patent Number: 5,863,597
[45] Date of Patent: *Jan. 26, 1999

[54] POLYURETHANE CONFORMAL COATING PROCESS FOR A PRINTED WIRING BOARD

[75] Inventor: Daniel M. Lynch, Rockford, Ill.

[73] Assignee: Sundstrand Corporation, Rockford, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 589,985

[22] Filed: Jan. 23, 1996

[51] Int. Cl.$^6$ ............... B05D 5/12; H05K 1/03; H05K 1/07

[52] U.S. Cl. ............ 427/96; 427/98; 427/443.2; 174/260; 174/254; 174/255; 174/256

[58] Field of Search ............... 427/96, 98, 443.2; 174/260, 254, 255, 256

[56] References Cited

U.S. PATENT DOCUMENTS

| | | |
|---|---|---|
| 3,433,888 | 3/1969 | Tally et al. . |
| 3,628,999 | 12/1971 | Schneble, Jr. et al. ............ 427/98 |
| 4,208,005 | 6/1980 | Nate et al. ............ 228/175 |
| 4,487,828 | 12/1984 | Hladovcak et al. ............ 430/313 |
| 4,506,004 | 3/1985 | Sullivan ............ 430/312 |
| 4,666,821 | 5/1987 | Hein et al. ............ 430/311 |
| 4,706,167 | 11/1987 | Sullivan ............ 427/96 |
| 4,830,922 | 5/1989 | Sparrowhawk et al. . |
| 4,966,827 | 10/1990 | Sullivan ............ 430/270 |
| 5,032,426 | 7/1991 | Sumner, Jr. . |
| 5,108,784 | 4/1992 | Anderson et al. . |
| 5,175,023 | 12/1992 | Iwase . |
| 5,240,817 | 8/1993 | Stout et al. ............ 430/315 |
| 5,246,730 | 9/1993 | Peirce et al. . |
| 5,290,608 | 3/1994 | Grunwald et al. ............ 427/493 |
| 5,510,138 | 4/1996 | Sanftleben et al. ............ 427/96 |

OTHER PUBLICATIONS

Publication entitled "Introduction to Conformal Coatings" dated Sep. 1992 pp. 1–16; Chase Corporation—Humiseal® Protective Coatings.

Publication entitled "Selection Criteria for the Use of Conformal Coatings" dated Sep. 1992 pp. 1–13. Chase Corporation–13 HumiSeal® Protective Coatings.

"International Photopolymers News",vol. 3, No. 3 Fall 1995 published by Ciba–Geigy Corporation pp. 1–12.

*Primary Examiner*—Shrive Beck
*Assistant Examiner*—Bret Chen
*Attorney, Agent, or Firm*—Kristin L. Chapman

[57] ABSTRACT

A cost-effective process for preventing mealing of a polyurethane conformal coating applied to a printed wiring board is described. The process includes utilizing a liquid photo-imagable solder mask for protecting the circuitry within the board prior to applying the polyurethane conformal coating. The process further includes applying the polyurethane coating within a controlled maximum thickness of 0.0015 inches for preventing vesication of the conformal coating. Additionally, a manufactured printed circuit substrate incorporating these steps is described.

16 Claims, 2 Drawing Sheets

POLYURETHANE CONFORMAL COATING PROCESS FOR A PRINTED WIRING BOARD

TECHNICAL FIELD

This invention relates to processes for manufacturing printed circuit boards, and more particularly, to applying conformal coatings which can withstand adverse environmental conditions.

BACKGROUND

Electrical power generating systems, such as electromechanical actuators and integrated drive generators (IDGs) employed in military and commercial aircraft, often utilize power electronic components to meet stringent design constraints and high power requirements. These electronic devices can include components secured to printed circuit boards by surface mount technology (SMT) as well as plated through-hole (PTH) components. Such components are typically soldered to a printed circuit board by either a wave soldering or reflowing soldering process. Substantial care must be taken during each of these manufacturing processes because the individual components tend to be brittle and the electrically conductive leads which attach the components to the board are fragile.

A series of manufactured printed wiring boards can be interconnected together to form a modular unit, such as an electronic control unit (ECU) for use with electric power generating systems. The ECU circuitry provides the conductive framework through which electrical signals are transmitted in order to provide power to various systems of the aircraft. The electronic components mounted on that circuitry can transmit such electrical signals through the circuitry.

Before the electronic components are mounted and soldered to the printed wiring board, it is a common practice to apply a solder mask to the circuitry. The solder mask acts to protect the circuitry from corrosive inhibitants. One solder mask available from Hysol Corporation is a dry film polymer solder mask which cures on the printed wiring board at a high temperature in an oven. However, as a dry film solder mask is susceptible to heat, care is required to minimize any variability in curing to prevent the solder mask from being cured on one portion of the board, but not another.

Once the electronic components are soldered to the printed circuit board, a protective film is typically applied over the entire board surface. Such a protective film is commonly referred to in the industry as a conformal coating. Conformal coatings are usually systems of synthetic resins, such as polyurethane, which when cured can provide a measure of protection of the components against environmental stresses and foreign object damage (FOD). These stresses include chemical corrosion, fungus growth, salt, dust, and fuel contamination, along with physical breakage from mechanical fatigue and shock. Conformal coatings may also serve in electrically insulating the electronic components and circuitry; thus, while they can protect against FOD, they can simultaneously lock any extraneous elements on the board underneath the coating. U.S. Pat. No. 5,246,730 to Peirce et al. and U.S. Pat. No. 4,830,922 to Sparrowhawk et al. are illustrative of such conformal coatings and discuss preferred minimum thicknesses of coatings which are applied to printed wiring boards.

In addition, printed circuit boards which are used in military marine, space and aircraft may be subjected to adverse environmental conditions of humidity and thermal shock. Condensation, which can form under humid conditions, can corrode the electrical components and lower the resistance between conductive elements of the circuit. This can accelerate high voltage breakdowns and eventually cause electrical shorting between elements of the circuit. A conformal coating can protect against condensation in typical situations.

Also, in order to compensate for these adverse conditions, a printed wiring board must be designed to comply with military specifications, such as MIL-C-28809. MIL-C-28809 specifies, among other things, that a manufactured board should pass a thermal shock test. This test entails heating the coated board to an extreme temperature, immediately subjecting the board to subzero temperatures, and then, cycling through these parameters one hundred (100) times.

One problem which has arisen in meeting this thermal shock requirement involves blistering or vesication of a portion of the polyurethane conformal coating. This blistering or vesication can occur either on the surface of an electronic component or from the board surface surrounding the component. Polyurethane conformal coatings are available as either single-part or multi-part curing systems and can provide excellent chemical resistance in certain environments. However, with such resistant properties, rework of a damaged portion of the polyurethane conformal coating becomes extremely difficult, involving labor intensive hours to avoid damaging the components. Thus, such repairs can be costly.

MIL-C-28809 further specifies that a manufactured printed circuit board must pass high humidity testing after being subjected to thermal shock. However, an additional problem can develop in conjunction with high humidity testing when using a polyurethane conformal coating. This problem is referred to as "mealing" or "white residue" and is visible on the surface of the printed circuit board as small, tightly spaced bubbles. Since the "mealing" phenomena tends to proliferate over the entire board surface, it is difficult to remove the complete coating and rework the entire surface, especially without damaging the solder mask or the electronic components' leads. Thus, complete batches of manufactured printed circuit boards can end up being scrapped due to this condition. This excess scrap can result in costly manufacturing operations.

It is, therefore, a primary object of the present inventor to determine the cause of the mealing phenomena, and to invent an improved manufacturing process for preventing such a phenomena from occurring with polyurethane conformal coatings which are applied to printed circuit boards. Other objects of the invention include providing the following:

(i) an improved manufacturing process for preventing vesication of polyurethane conformal coatings applied to printed circuit boards;

(ii) a cost-effective manufacturing process;

(iii) a manufacturing process which substantially eliminates rework of polyurethane conformal coatings applied to printed wiring boards;

(iv) an improved manufactured printed wiring board which can withstand thermal shock conditions;

(v) an improved manufactured printed wiring board which can withstand high humidity conditions; and (vi) an improved printed circuit board which meets the requirements of MIL-C-28809.

SUMMARY OF THE INVENTION

This invention relates to processing printed circuit boards having polyurethane conformal coatings which can withstand adverse environmental conditions such as high humidity and thermal shock, by matching the chemical compatibilities and processing techniques of solder masks when used in conjunction with polyurethane conformal coatings.

One embodiment of the invention includes a process for preventing mealing of a polyurethane coating which is applied to a printed wiring board. The printed wiring board includes at least one electronic component which is mounted thereon and electrically connected by circuitry within the printed wiring board. The process includes utilizing a liquid photoimagable solder mask for protecting the circuitry on a surface of the printed wiring board prior to the polyurethane coating being applied to the printed wiring board.

Preferably, the process further includes a step of applying the polyurethane coating to the printed wiring board within a controlled or limited maximum thickness. The controlled maximum thickness serves to prevent vesication of the polyurethane coating. Preferably, the controlled maximum thickness of the polyurethane coating is selected as approximately 0.0015 inches.

This invention further contemplates use with an advanced design of a printed circuit substrate. The printed circuit substrate includes electrical circuitry within the substrate for conducting electrical signals between a plurality of electrical components which are attached to the printed circuit substrate. The substrate includes a liquid photoimagable solder mask which is applied over the circuitry for protecting the circuitry. The substrate further includes a substantially uniform polyurethane coating which is applied over the liquid photoimagable solder mask and the electrical components. The polyurethane coating protects the electrical components and prevents mealing of the printed circuit substrate.

A further embodiment of the substrate contemplates the polyurethane coating including a controlled maximum thickness. The controlled maximum thickness serves to prevent vesication of the polyurethane coating. Preferably, the maximum thickness is controlled at approximately 0.0015 inches.

Other objects, aspects and advantages of the invention will become readily apparent upon consideration of the following drawings and detailed descriptions of preferred embodiments.

DESCRIPTION OF THE PREFERRED EMBODIMENTS

Figure 1:
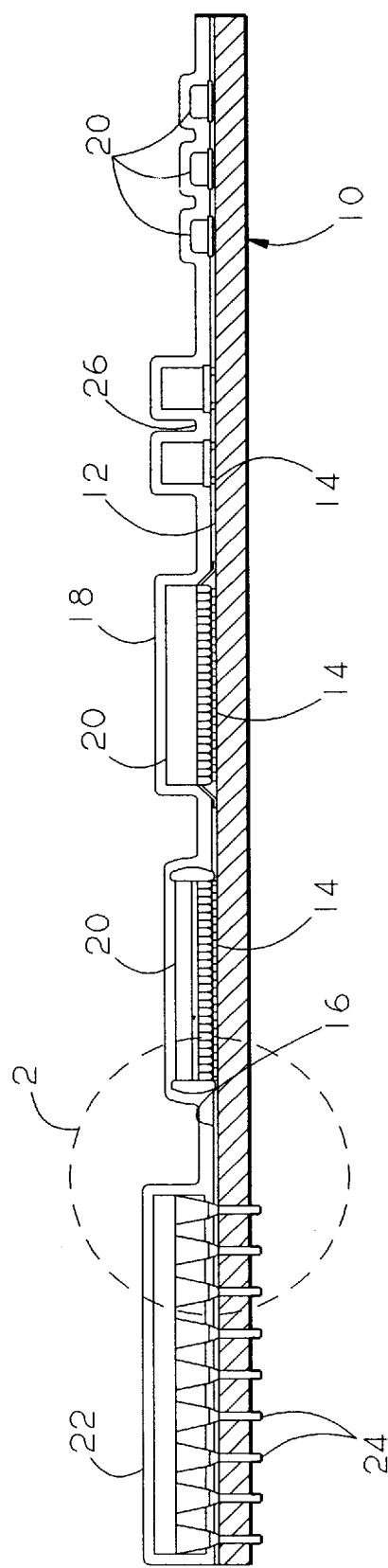
FIG. 1 is a cross-sectional view of a manufactured printed wiring board according to the instant invention.

FIG. 1 illustrates an exemplary embodiment of a printed circuit substrate 10 which can be utilized in an electronic control unit (ECU). Such an ECU can be used in conjunction with an electrical power generating system as found in an aircraft (not shown). The term printed circuit substrate 10 as used herein is intended to be interchangeable with the terms printed circuit board and printed wiring board.

Preferably the printed circuit substrate 10 is constructed as a laminate of glass/epoxy material. This laminate generally defines a substantially planar surface 12 onto which electronic components 20 and 22 are attached. Any number of components 20 and 22 can be incorporated to provide a desired electrical signal network. These components may include surface mount technology (SMT) components 20 which can be soldered to the substrate through a manufacturing reflow process. Plated through-hole (PTH) component 22 indicates an additional type of electrical component which has leads 24 in electrical contact with the substrate 10. PTH component 22 may be attached to the substrate 10 by a typical wave soldering process or a refined reflow soldering process.

SMT and PTH components 20 and 22 are electrically interconnected by conductive circuitry 14 which typically appears as a network on the planar surface 12. The circuitry 14 is usually comprised of copper traces which lay out a framework of conductive contact locations or pads. These pads of the circuitry 14 allow the various SMT and PTH components 20 and 22 to be positioned for maximum power and efficiency while taking into account both layout design and cooling requirements.

The copper traces of the circuitry 14 may be treated with a layer of tin/lead (Sn/Pb) alloy. Since Sn/Pb is conductive and prevents oxidation of the copper pads, treatment may be desirable, if designing to military specifications, as the solder joints to which the leads of the components 20 attach tend to stabilize in the Sn/Pb alloy. This can create, in some situations, a more reliable solder connection between the circuitry 14 and each component 20, thus preventing disconnect or "shorting" during operation of the power generating system.

Figure 2:
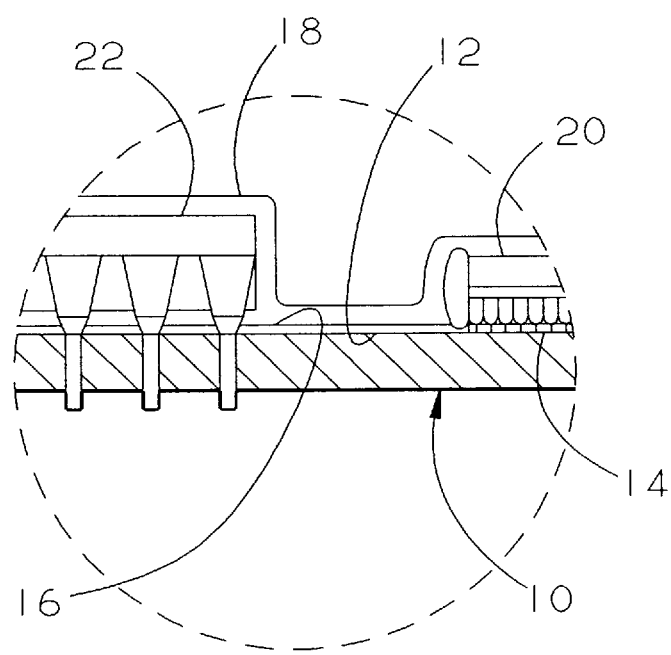
FIG. 2 is an enlarged view of the printed wiring board of FIG. 1 according to the instant invention.

As shown in FIG. 1 and the enlarged view of FIG. 2, the printed circuit substrate 10 further includes a solder mask 16 which is exaggerated in thickness in the drawings for illustrative purposes. The solder mask 16 is applied over the circuitry 14 prior to the components 20 and 22 being soldered to the substrate 10. Preferably, the solder mask 16 is of a liquid photoimagable type, such as the Valu-SMT® series sold by E.I. Dupont de Nemours and Company or Probimer® sold by the Ciba-Geigy Corporation. The solder mask 16 provides dielectric and mechanical protection of the circuitry during and after soldering operations. Typically, the solder mask 16 is applied uniformly over the copper traces of the circuitry 14 with a stencil or with a curtain coat process. The substrate 10 which has been coated with the liquid photoimagable solder mask 16 is then set into a chamber. Once inside the chamber, the substrate 10 is exposed to ultraviolet light which cures the liquid photoimagable solder mask 16. Preferably, the cured solder mask 16 exhibits no visible cracks, scratches, or other surface defects even after the soldering processes which attach either the SMT components 20 or PTH components to the substrate 10.

The printed circuit substrate 10 further includes a conformal coating 18 which is then applied over the circuitry 14, liquid photoimagable solder mask 16, and electronic components 20 and 22. While several types of conformal coatings are available including acrylic, silicone and parylene, the instant invention contemplates a substrate 10 which embodies a polyurethane conformal coating 18 to provide superior chemical resistance and dielectric properties in the typical environment of a military aircraft. An example of such an acceptable polyurethane conformal coating is sold as Hysol PC 18 M coating by the Hysol Corporation.

As the substrate 10 of the instant invention embodies the polyurethane coating 18, it is advantageous to utilize a liquid photoimagable solder mask 16 to help eliminate the problem of "mealing" during military specification testing and subsequent humid performance conditions. A liquid photoimagable solder mask 16 is preferable to a dry film solder mask because the dry film is susceptible to heat and may vary curing times over separate locations on the substrate 10. Since the liquid photoimagable solder mask 16 is cured by ultraviolet light as opposed to heat, any variability with curing the solder mask 16 is eliminated.

If indeed a dry film solder mask is used, the variability in curing can leave certain portions of the substrate 10 uncured, even after the polyurethane conformal coating 18 is applied. Both the dry film solder mask and the polyurethane coating are polymer-based. Once the substrate is exposed to a temperature increase and humid environmental condition as with MIL-C-28809 testing, water molecules can be introduced causing a chemical reaction of reversion. Since the "prior to curing" state of each polymer (dry film solder mask and polyurethane coating) is liquid, reversion results in a physical change of the polymer from the polymer from a solid state back to a liquid state. However, reversion of the polymerized material does not return to the original dry film and polyurethane constituents. Instead, the chemical reaction causes a repolymerization to a different compound which is incompatible with humid conditions.

Polyurethane coatings contain ester bonds which are susceptible to reversion because of poor resistance of their polyester linkages to hydroxyl ion attack. As temperature increases in a highly humid environment, the velocity of traveling water molecules also increases, causing the molecules' capability of producing hydrolysis to subsequently increase. Hydrolysis can be defined as a decomposition in which a compound is split into other compounds by taking up the elements of water (hydrogen and oxygen). Thus, molecules of the repolymerized material which cannot resist the impacting water molecules are broken apart. Since the repolymerized material is affected by the water molecules, it becomes softer as shorter chain molecules form. The effect eventually assumes a near liquid state with minimal hardness.

For example, the reformation of the original isocyanate and hydroxyl groups of the dry film solder mask through the hydrolysis of a polymer elastomer (i.e. the polyurethane coating) can yield the following reaction:

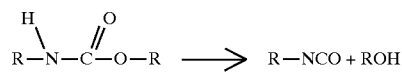

Similarly, the reaction of the reformed isocyanate compound with the impacting water molecules can cause the release of carbon dioxide as shown in the following equation:

It is this carbon dioxide release which is believed to produce gaseous pockets between the dry film solder mask and the polyurethane coating. These gaseous pockets appear as tiny bubbles or "white residue", otherwise referred to as "mealing". By utilizing the liquid photoimagable solder mask 16, the mealing phenomena can be prevented because ultraviolet light fully cures the solder mask 16. By fully curing, the exposed solder mask can remain insoluble in developing solution. Because the mealing condition can be prevented in the polyurethane coating 18 when utilizing the liquid photoimagable solder mask 16, additional rework of the polyurethane coating 18, which is difficult and costly, can be avoided. This is advantageous when designing and manufacturing a printed circuit substrate 10 for use in either a military or commercial aerospace program.

Since the polyurethane conformal coating 18 provides a barrier against moisture and airborne contaminants, it also seals in any contaminants with its insulating properties. Thus, prior to applying the polyurethane coating 18, it is preferable to degrease and clean the substrate 10 to eliminate any foreign objects, such as dust, dirt, oil, or fingerprints, which may impair adhesion. Once cleaned, the substrate 10 can be handled by lint-free groves or finger cots.

Preferably, the polyurethane conformal coating 18 is applied using a spray process whereby a layer of the material is deposited by using a zicon gun or conventional spray gun. An even motion of spraying is preferred to minimize overlap of sprayed areas.

Alternatively, the polyurethane coating 18 can be applied by immersing the cleaned substrate 10 into the coating material at room temperature (i.e. 70°F.±10°F.). The immersion can be performed at a rate of 3.5–4.5 inches per minute, or at an even rate which achieves complete wetting, while preventing air entrapment or bubbling of the polyurethane coating material. The substrate 10 typically remains completely immersed for a period of 30–40 seconds or until completely wetted. The substrate 10 is then withdrawn from the bath of coating material at the same rate as immersion and allowed an initial run-off time until dripping of the polyurethane coating stops (approximately ten minutes).

With either suitable process for applying the polyurethane conformal coating 18, the substrate 10, in a preferred embodiment, includes a maximum thickness which is controlled or limited to prevent excess coating buildup. This buildup, if not prevented, can result in blistering and vesication of the coating 18 under high temperature or thermal shock conditions. The controlled maximum thickness should fall within a range of 0.002±0.001 inches, preferably 0.0015 inches. By controlling this maximum thickness, bridging of the coating 18 between the components 20 is minimized and the coating 18, especially around fillet area 26, is fully cured prior to beginning any thermal cycling during testing or operation. It can be appreciated in light of these tight dimensions, the thickness of the polyurethane coating 18 depicted in FIGS. 1 and 2 has been exaggerated for illustrative purposes only.

Additionally, by employing the liquid photoimagable solder mask 16 in conjunction with the polyurethane coating 18, the differential in thermal growth due to coefficient of thermal expansion (CTE) mismatch between the two layers is maintained within an acceptable level as a function of the coating thickness. This prevents shearing of the polyurethane coating 18 from the solder mask 16 and the surface 12 of the substrate 10 which can also result in vesication.

Numerous modifications in the alternative embodiments of the invention will be apparent to those skilled in the art in view of the foregoing description. Accordingly, this description is to be construed as illustrative only and is for the purpose of enabling those skilled in the art to make and use the invention and teaching the best mode of carrying out the invention. The exclusive rights of all modifications which come within the scope of the appended claims is reserved.

I claim:

1. A process for preventing mealing of a polyurethane conformal coating applied to a printed wiring board having an electrical component mounted thereon and electrically connected by electrical circuitry, comprising the steps of:

applying a liquid photoimageable solder mask;

curing the photoimageable solder mask to a solid state using ultraviolet light;

affixing the electrical component to the electrical circuitry; and applying the polyurethane conformal coating over the printed wiring board, the electrical circuitry, the solder mask, and the electrical component.

2. The process of claim 1 wherein the polyurethane conformal coating has a thickness in the range of approximately 0.001 inches to approximately 0.002 inches.

3. The process of claim 2, wherein the polyurethane conformal coating has a thickness of approximately 0.0015 inches.

4. The process of claim 1, wherein the polyurethane conformal coating has a coefficient of thermal expansion which matches that of the solder mask and the substrate.

5. The process of claim 1, wherein prior to applying the polyurethane conformal coating, the printed wiring board is cleaned.

6. The process of claim 1, wherein the step of applying the polyurethane conformal coating comprises:

immersing the printed wiring board into liquid polyurethane at a constant rate.

7. The process of claim 6, where the immersion rate is between approximately 3.5 to 4.5 inches per minute.

8. The process of claim 1, wherein the step of applying the polyurethane conformal coating comprises:

spraying liquid polyurethane onto the printed wiring board.

9. A printed circuit board having electrical circuitry attached to a substrate and having a plurality of attached electrical components, the printed circuit board comprising:

a liquid photoimageable solder mask applied over the substrate and the electrical circuitry, the solder mask having been cured to a solid state using ultraviolet light;

a plurality of electrical components attached to the printed circuit board and electrically connected to the electrical circuitry; and a substantially uniform polyurethane coating applied over the substrate, the electrical circuitry, the solder mask, and the electrical components, the polyurethane coating preventing the formation of bubbles at an interface between the solder mask and the polyurethane coating.

10. The printed circuit board of claim 9, wherein the polyurethane conformal coating has a thickness in the range of approximately 0.001 inches to approximately 0.002 inches.

11. The printed circuit board of claim 10, wherein the polyurethane conformal coating has a thickness of approximately 0.0015 inches.

12. The printed circuit board of claim 9, wherein the polyurethane conformal coating has a coefficient of thermal expansion which matches that of the solder mask and the substrate.

13. The printed circuit board of claim 9, wherein prior to applying the polyurethane conformal coating, the printed wiring board is cleaned.

14. The printed circuit board of claim 9, wherein the step of applying the polyurethane conformal coating comprises:

immersing the printed wiring board into liquid polyurethane at a constant rate.

15. The printed circuit board of claim 14, where the immersion rate is between approximately 3.5 to 4.5 inches per minute.

16. The printed circuit board of claim 9, wherein the step of applying the polyurethane conformal coating comprises:

spraying liquid polyurethane onto the printed wiring board.

* * * * *